(12) United States Patent
Hotta

(10) Patent No.: US 6,185,142 B1
(45) Date of Patent: Feb. 6, 2001

(54) APPARATUS FOR A SEMICONDUCTOR MEMORY WITH INDEPENDENT REFERENCE VOLTAGE

(75) Inventor: Yasuhiro Hotta, Nara (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/296,902

(22) Filed: Apr. 22, 1999

(30) Foreign Application Priority Data

Apr. 24, 1998 (JP) .................................................. 10-114445

(51) Int. Cl.$^7$ ...................................................... G11C 7/02
(52) U.S. Cl. ...................... 365/207; 365/205; 365/189.09
(58) Field of Search ..................................... 365/207, 205, 365/208, 210, 189.09

(56) References Cited

U.S. PATENT DOCUMENTS 5,771,197 * 6/1998 Kim ...................................... 365/210
5,841,718 * 11/1998 Watters et al. ....................... 365/208
5,991,209 * 11/1999 Chow ............................... 365/189.05

FOREIGN PATENT DOCUMENTS 61-184794    8/1986   (JP) .

* cited by examiner

*Primary Examiner*—Vu A. Le
(74) *Attorney, Agent, or Firm*—Morrison & Foerster LLP

(57) ABSTRACT

A semiconductor memory of the present invention includes a sense amplifier for amplifying a potential difference between a potential of a first terminal and a potential of a second terminal, a first load gate located between the first terminal and a bit line, and a second load gate located between the second terminal and a reference line. A current flowing to the first load gate is controlled by a potential of the bit line, and a current flowing to the second load gate is controlled by a potential of the reference line.

7 Claims, 10 Drawing Sheets

APPARATUS FOR A SEMICONDUCTOR MEMORY WITH INDEPENDENT REFERENCE VOLTAGE

BACKGROUND OF THE INVENTION

1. Field of the Invention

The present invention relates to a sense amplifier, and more particularly, to a technique which is effective in decreasing the consumption of current and a surface area of a chip, and increasing an operation speed.

2. Description of the Related Art

FIG. 5 is a circuit diagram showing a part of a Dynamic Random-Access Memory (DRAM) 300 including the conventional open bit line system.

The DRAM 300 includes a memory cell MC, a dummy cell MD, a bit line BL for reading data stored in the memory cell MC, a bit line /BL for reading data stored in the dummy cell MD, a word line WL for selecting the memory cell MC, a dummy word line WD for selecting the dummy cell MD and a sense amplifier SA. The sense amplifier SA is operated by control signals $\phi 1$ and $/\phi 1$.

FIG. 6 shows a signal wave shape in an operation of reading cell data in the nonvolatile memory 300. First, during a precharge period (t0–t1), the bit lines BL and /BL are precharged and equalized by a precharge/equalization circuit (not shown) while the word line WL and the dummy word line WD are not activated.

For example, when the memory cell MC shown in FIG. 6 is selected, the word line WL and the dummy word line WD corresponding thereto are activated at time t1, thereby generating a very small potential difference between the bit lines BL and /BL in response to the state of the stored charge in the memory cell MC.

Next, a sense amplifier SA is activated by the control signal $\phi 1$ at time t2, and a potential difference between a potential Vbit of the bit line BL and a potential /Vbit of the bit line /BL is sensed and latched.

Furthermore, one of the potentials Vbit and /Vbit is amplified so as to be a power supply potential Vdd, and the other of the potentials Vbit and /Vbit is amplified so as to be a ground potential GND. Thus, data is read out of and/or rewritten in the selected memory cell.

Japanese Laid-Open Publication No. 61-184794 discloses application of the above described configuration to a nonvolatile memory such as an EPROM (Erasable Programmable Read Only Memory), a Mask ROM (Mask programmable Read Only Memory) or the like. Such an application is possible because the consumption of current can be more easily decreased in a latch-type sense amplifier than a current mirror type differential amplifier.

In a memory cell of the conventional DRAM 300 shown in FIG. 5, a through current does not exist after the potential of the bit line BL is fixed. On the other hand, in a nonvolatile memory such as the EPROM, data is stored by the presence and absence of a current flowing in the memory cell transistor. Therefore, after the potential of the bit line BL is fixed, a conducting current of the memory cell continues to flow.

In the above described nonvolatile memory, a high potential cannot be applied to the bit line for a long period because of degradation of a voltage resistance of the memory cell caused by micronization, release of electric charges from a floating gate or the like.

In order to solve the above problems, transfer gates QA1 and QA2 are provided between the bit line BL and an input terminals of the sense amplifier SA, as shown in FIG. 7, so as to electrically separate the bit line BL and the sense amplifier SA after a sense/latch operation is completed. The sense amplifier SA is operated by control signals $\phi 1$ and $/\phi 1$. The transfer gates QA1 and QA2 are operated by a control signal $/\phi 2$.

Generally, in the nonvolatile memory, an open bit line system is not adopted. Data is read by comparing a potential Vbit of a bit line BL with a reference potential Vbit, which is commonly shared by the bit lines, in a sense amplifier SA.

FIG. 8 shows a conventional nonvolatile memory 400.

The nonvolatile memory 400 includes a plurality of sense amplifiers SAA corresponding to a plurality of read data D1, D2 and D3, and a reference potential generation circuit REF which is commonly used by the plurality of sense amplifiers SAA. The bit line RL is connected to an input terminal of the sense amplifier SAA. The common reference line RL is connected to the other input terminal of the sense amplifier SAA.

In the nonvolatile memory 400 shown in FIG. 8, the reference potential generation circuit REF sets a threshold value of the memory cell MD at the middle of on and off to generate an intermediate potential of the potential Vbit of the bit line BL, which acts as a reference potential Vref.

FIG. 9 shows a signal wave shape in an operation of reading cell data in the nonvolatile memory 400.

During a precharge period (t0–t1), the bit line BL and the reference line RL are precharged and equalized by a precharge/equalization circuit (not shown). Next, for example, when the memory cell MC is selected, the word line WL and the reference potential generation circuit REF are activated at time t1. Thereby, a very small potential difference is generated between the bit line BL and the reference line RL in response to the state of the above memory cell MC (on or off). At time t2, the sense amplifier SAA is activated by a control signal $\phi 1$, and a potential difference between the potential Vbit of the bit line BL and the reference potential Vref of the reference line RL is sensed and latched. After the latched data is fixed, at time t3, transfer gates QA1 and QA2 are turned off so as to disconnect the sense amplifier SAA and the bit line BL, and the sense amplifier SAA and the reference line RL, respectively.

Referring to the sense amplifier SAA in FIG. 7, since a load capacitance C2 between an input of the sense amplifier SA and the transfer gate QA1 and QA2 is smaller than a bit line capacitance C1, in order to fix a latch stably, the disconnection of the transfer gate (t3) needs to be performed after the sense/latch operation is completed.

Japanese Laid-Open Publication No. 10-11975 discloses a configuration of a latch-type sense amplifier used for a SRAM (Static RAM), which is arranged for achieving a high speed operation and decreasing consumption of electric power.

FIG. 10 is a circuit diagram of a sense amplifier 500 which is designed for decreasing a consumption of electric power.

The sense amplifier 500 shown in FIG. 10 includes a pair of N-type transistors QE1 and QE2 wherein drain electrodes thereof are connected to gate electrodes of each other so that each drain electrode acts as a sense output terminal, input transistors QE3 to QE6 which connect the potentials Vbit and /Vbit of the bit lines BL and /BL only to the gate electrodes, and P-type control transistors QE7 and QE8 which supply a load current to the sense output terminals through the input transistors QE3 to QE6 during an activation period.

In the above described open bit system, the bit lines are provided such that the sense amplifier is placed between the bit lines corresponding to the memory cells MC and the bit lines corresponding to the dummy memory cells MD, respectively. Therefore, it is necessary to provide dummy memories corresponding to respective bit lines. As a result, the surface area of a chip increases.

In the conventional nonvolatile memory, by rewriting data of the sense/latch operation during a period for reading data (t2–t3), a potential Vref of the reference line RL varies at the same time that a potential Vbit of the bit line BL varies. The potential Vref varies according to the potential Vbit of the bit line BL.

As shown in FIG. 9, the reference potential Vref moves in a direction opposite from a direction in which the potential Vbit of the bit line BL moves. When the memory cell is on, the potential Vbit of the bit line BL changes to a line Vbit (0) shown in FIG. 9, and the reference potential Vref changes to a line Vref (0) shown in FIG. 9. When the memory cell is off, the potential Vbit of the bit line BL changes to a line Vbit (1) shown in FIG. 9, and the reference potential Vref changes to a line Vref (1) shown in FIG 9. Therefore, a plurality of sense amplifiers cannot share one reference line.

Furthermore, during a period (t2–t3) shown in FIG. 9, since the load capacitance C1 of the bit line BL, which is larger than the load capacitance C2 of the bit line BL is connected to the output terminal of the sense amplifier in addition to the load capacitance of the bit line C2, as shown in FIG. 7, an operation speed of the sense amplifier decreases.

In the sense amplifier 500 shown in FIG. 10, during the activating period, a through current of the sense amplifier is controlled by the input transistors QE3 to QE6. When the potential Vbit of the bit line BL is the intermediate potential, the through current continues to flow to the transistors. For example, since the potential Vbit of the bit line BL is fixed at a high potential or a low potential in a relatively early period, the through current is interrupted in a relatively early period. However, in the nonvolatile memory, since the potential Vbit of the bit line BL and the reference potential Vref generate only a very small potential difference in the vicinity of the intermediate potential, the through current continues to flow to the transistors during an activating period of the sense amplifier SA, so that the consumption of electric power increases.

SUMMARY OF THE INVENTION

The present invention provides a semiconductor memory including: a sense amplifier for amplifying a potential difference between a potential of a first terminal and a potential of a second terminal; a first load gate located between the first terminal and a bit line; and a second load gate located between the second terminal and a reference line. In the semiconductor memory of the present invention, a current flowing to the first load gate is controlled by a potential of the bit line, and a current flowing to the second load gate is controlled by a potential of the reference line.

The semiconductor memory of the present invention further includes a first control gate connected to the first load gate, and a second control gate connected to the second load gate.

In one embodiment, after an operation of the sense amplifier is completed, the first control gate interrupts the current flowing to the first load gate, and the second control gate interrupts the current flowing to the second load gate.

In another embodiment, the sense amplifier is a latch-type sense amplifier.

In still another embodiment, the first and second load gates are MOS transistors.

In still another embodiment, the first and second control gates are MOS transistors.

In still another embodiment, a current output from the first load gate flows from the first load gate to the first terminal, and a current output from the second load gate flows from the second load gate to the second terminal.

According to the present invention, a latch-type sense amplifier can be used for the nonvolatile memory. Therefore, compared with the conventional current mirror type sense amplifier, the consumption of electric power can be decreased. Furthermore, since the reference potential generation circuit can be shared by a plurality of the sense amplifiers, it is possible to decrease the surface area of the chip.

Moreover, since no through current is generated after the sense/latch operation is completed, the consumption of electric power can be significantly decreased.

Thus, the invention described herein makes possible the advantage of providing a semiconductor memory wherein a high speed operation with a decreased consumption of electric power can be achieved while the surface area of the chip is decreased.

This and other advantages of the present invention will become apparent to those skilled in the art upon reading and understanding the following detailed description with reference to the accompanying figures.

DESCRIPTION OF THE PREFERRED EMBODIMENTS (Embodiment 1)

Hereinafter, Embodiment 1 of the present invention will be described with reference to FIGS. 1 and 2.

Figure 1:
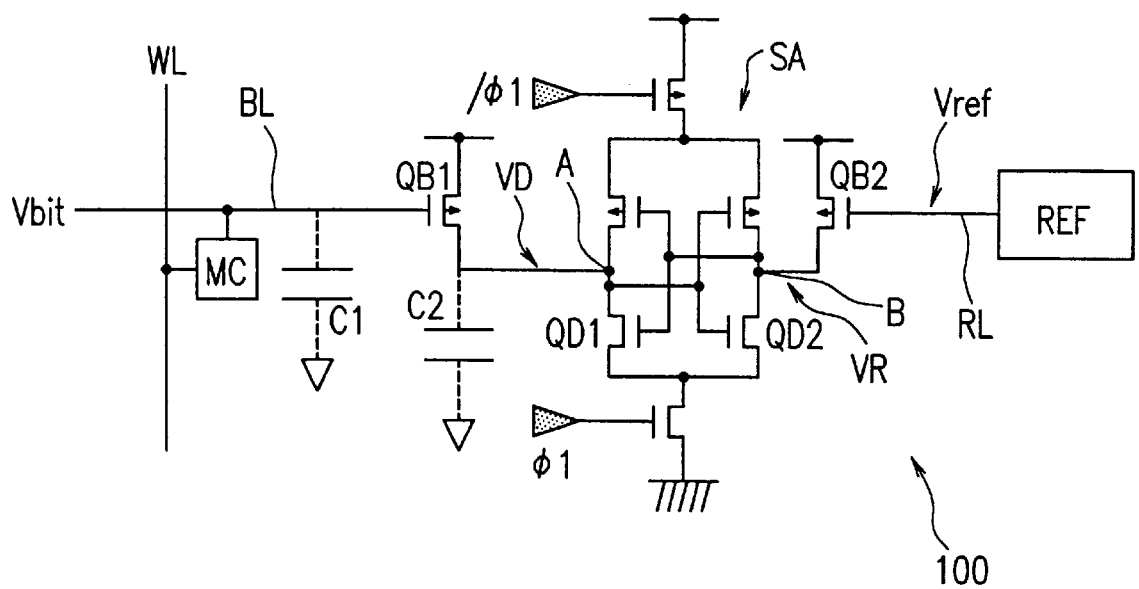
FIG. 1 is a circuit diagram showing a primary portion of a nonvolatile memory 100 of Embodiment 1 according to the present invention.
Figure 2:
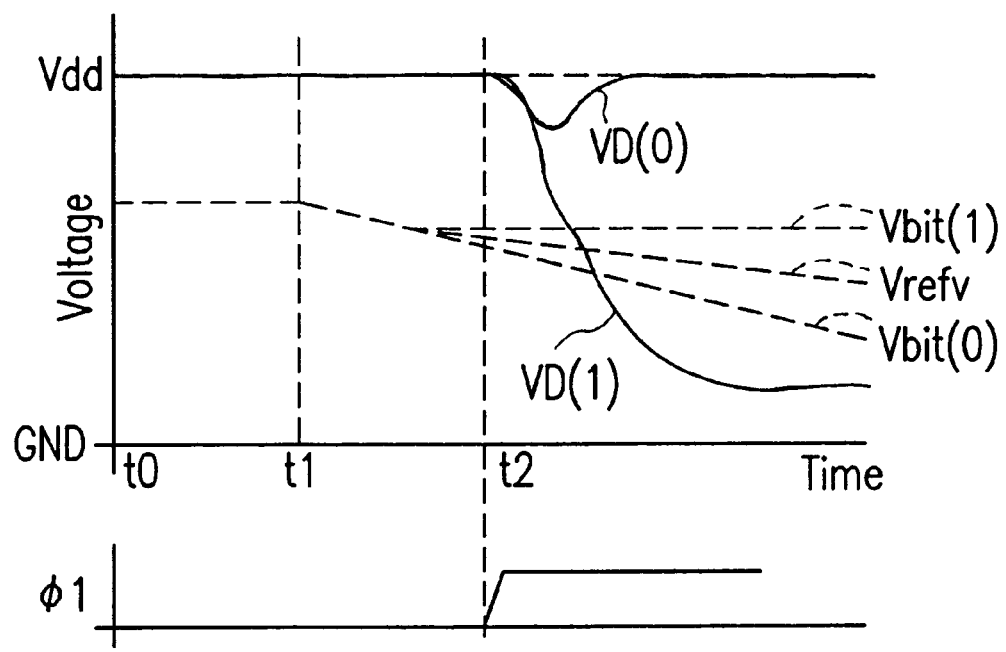
FIG. 2 shows a signal wave shape in an operation of reading cell data stored in a memory cell MC of a nonvolatile memory 200 of Embodiment 2 according to the present invention.

FIG. 1 is a circuit diagram showing a primary portion of a nonvolatile memory 100 in Embodiment 1. Specifically, FIG. 1 illustrates a part of a column of a memory cell array of the nonvolatile memory 100. The nonvolatile memory 100 is, for example, a Mask ROM, an EPROM, an EEPROM, a flash memory or the like.

The nonvolatile memory 100 includes a sense amplifier SA which amplifies a potential difference between a potential VD of a first terminal A and a potential VR of a second terminal B, a first load gate QB1 located between the first terminal A and a bit line BL, and a second load gate QB2 located between the second terminal B and a reference line RL.

The sense amplifier SA operated by control signals φ1 and /φ1 is, for example, a synchronous type sense amplifier using a CMOS flip-flop circuit.

Memory cell MC is one memory cell representative of a plurality of memory cells. The memory cell MC is connected to the bit line BL and a word line WL.

Data stored in the memory cell MC is read out to the bit line BL. The word line WL is used for selecting one memory cell from the plurality of memory cells. A reference potential Vref generated in a reference potential generation circuit REF is applied to the reference line RL.

Hereinafter, an operation of reading data stored in the memory MC of the nonvolatile memory 100 will be described with reference to FIG. 2.

During a precharge period (t0–t1), the bit line BL and the reference line RL are precharged and equalized by a precharge/equalization circuit (not shown).

When the memory cell MC is selected, the reference potential generation circuit REF and the word line WL connected to the memory cell MC are activated at time t1. Thereby, a very small potential difference is generated between the bit line BL and the reference line RL in response to the state of the above memory cell MC (on-state or off-state).

Next, at time t2, the sense amplifier SA is activated by a control signal φ1, and a potential difference between the potential Vbit of the bit line BL and the reference potential Vref of the reference line RL is sensed and latched. When the potential difference is sensed and latched, the reference potential Vref of the reference line RL moves to a Vrefv. When the potential difference is sensed and latched, in the case where the memory cell MC is on, the potential Vbit of the bit line BL becomes a line Vbit (0) shown in FIG. 2 so that an output potential of the sense amplifier SA moves from Vdd to a line VD (0) shown in FIG. 2. Alternatively, in the case where the memory cell MC is off-state, the potential Vbit of the bit line BL becomes a line Vbit (1) shown in FIG. 2 so that the output potential of the sense amplifier SA moves from Vdd to a line VD (1) shown in FIG. 2.

Furthermore, in Embodiment 1, during the period when the sense amplifier SA is activated, a through current flows between the load transistor QB1 and a transistor QD1. Alternatively, the through current flows between the load transistor QB2 and a transistor QD2.

In Embodiment 1, the potential Vbit of the bit line BL and the reference potential Vref of the reference line RL do not move by a writing operation performed by the sense/latch operation. Therefore, the reference potential Vref can be shared by a plurality of sense amplifiers. Thus, it is not necessary to provide the reference potential generation circuit REF.

In Embodiment 1, since it is possible to decrease a load capacitance C2 connected to the output terminal of the sense amplifier SA, the sense amplifier SA can operate at high speed. C1 represents a load capacitance of the bit line BL.

(Embodiment 2)

Hereinafter, Embodiment 2 of the present invention will be described with reference to FIGS. 3 and 4.

Figure 3:
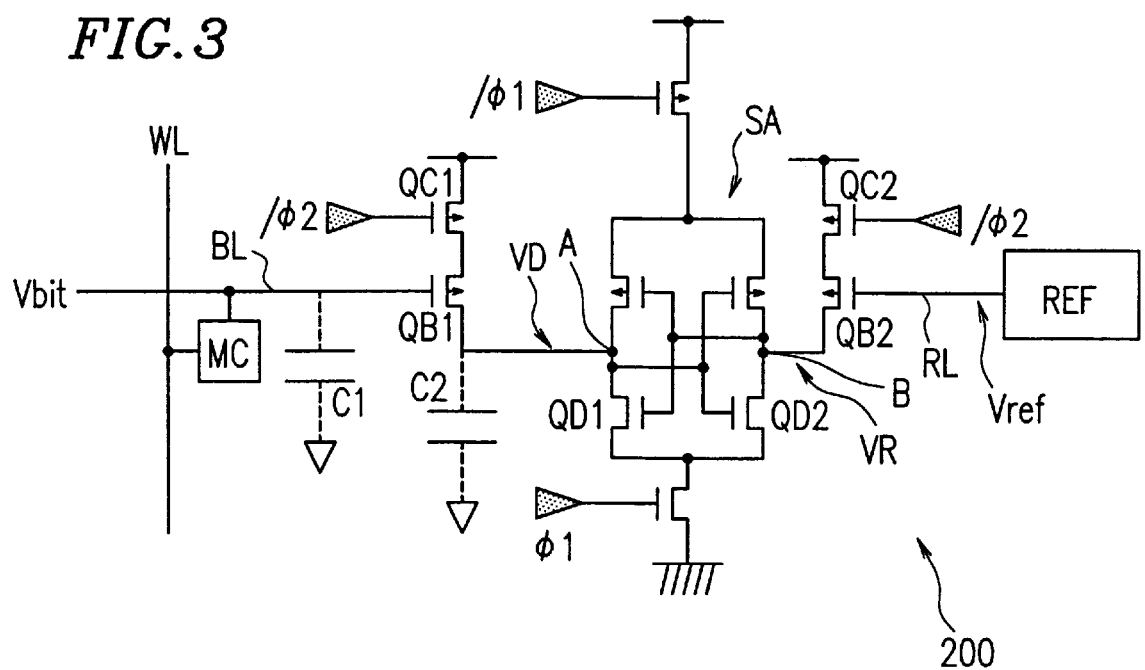
FIG. 3 is a circuit diagram showing a primary portion of the nonvolatile memory 200 of Embodiment 2.

FIG. 3 is a circuit diagram showing a primary portion of a nonvolatile memory 200 of Embodiment 2. Specifically, FIG. 3 shows a part of a column of a memory cell array in the nonvolatile memory 200. The nonvolatile memory 200 is, for example, a Mask ROM, EPROM, EEPROM, a flash memory or the like.

The nonvolatile memory 200 includes a sense amplifier SA which amplifies a potential difference between a potential VD of a first terminal (output terminal) A and a potential VR of a second terminal B, a first load gate QB1 located between the first terminal A and a bit line BL, a second load gate QB2 located between the second terminal B and a reference line RL, a first control gate QC1 and a second control gate QC2. Hereinafter, the first control gate QC1 is referred to as a first transfer gate QC1, and the second control gate QC2 is referred to as a second transfer gate QC2. The first control gate QC1 is connected between a reference potential point and the first load gate QB1, and the second control gate QC2 is connected between the reference potential point and the second load gate QB2.

The sense amplifier SA operated by control signals φ1 and /φ1 is, for example, a synchronous type sense amplifier using a CMOS flip-flop circuit. Memory cell MC is one memory cell representative of a plurality of memory cells. The memory cell MC is connected to the bit line BL and a word line WL.

Data stored in the memory cell MC is read out to the bit line BL. The word line WL is used for selecting one memory cell from the plurality of memory cells. A reference potential Vref generated in a reference potential generation circuit REF is applied to the reference line RL.

A control signal /φ2 is input to gates of the transfer gates QC1 and QC2.

Hereinafter, an operation of reading data stored in the memory MC of the nonvolatile memory 200 will be described with reference to FIG. 4.

During a precharge period (t0–t1), the bit line BL and the reference line RL are precharged and equalized by a precharge/equalization circuit (not shown).

When the memory cell MC is selected, the word line WL and the reference potential generation circuit REF connected to the memory cell MC are activated at time t1. Thereby, a very small potential difference is generated between the bit line BL and the reference line RL in response to the state of the above memory cell MC (on or off).

Next, at time t2, the sense amplifier SA is activated by a control signal φ1, and a potential difference between the potential Vbit of the bit line BL and the reference potential Vref of the reference line RL is sensed and latched. When the potential difference is sensed and latched, the reference potential Vref of the reference line RL moves to a Vrefv.

After the potential difference is sensed and latched, and the latched data is fixed, the transfer gates QC1 and QC2 are tuned off at time t3 to disconnect the sense amplifier SA and the reference potential point.

In Embodiment 2, since current flowing to the load transistors QB1 and QB2 are interrupted after the sense/latch operation is completed, the through current does not flow between the load transistor QB1 and the transistor QD1 and between the load transistor QB2 and the transistor QD2 while the sense amplifier SA is activated. Thus, when compared with Embodiment 1, the consumption of electric power can be further reduced in Embodiment 2.

Figure 4:
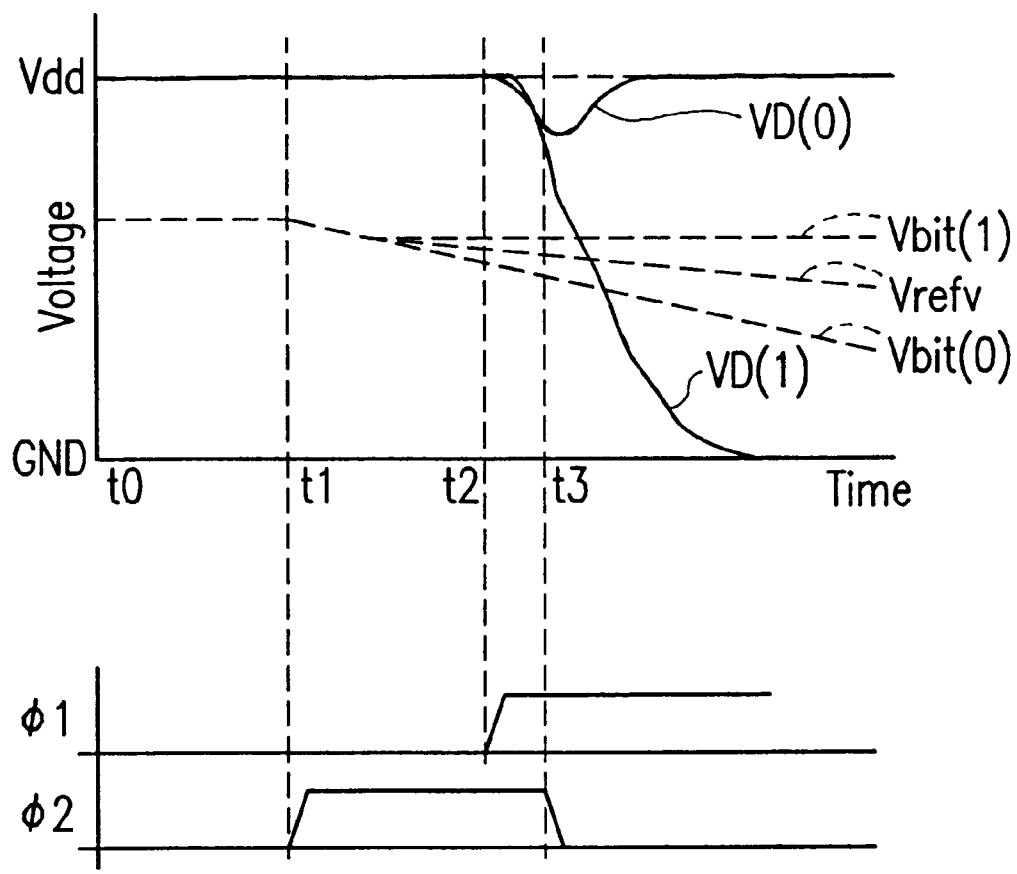
FIG. 4 shows a signal wave shape in an operation of reading cell data stored in the memory cell MC of the nonvolatile memory 200 of Embodiment 2.
Figure 5:
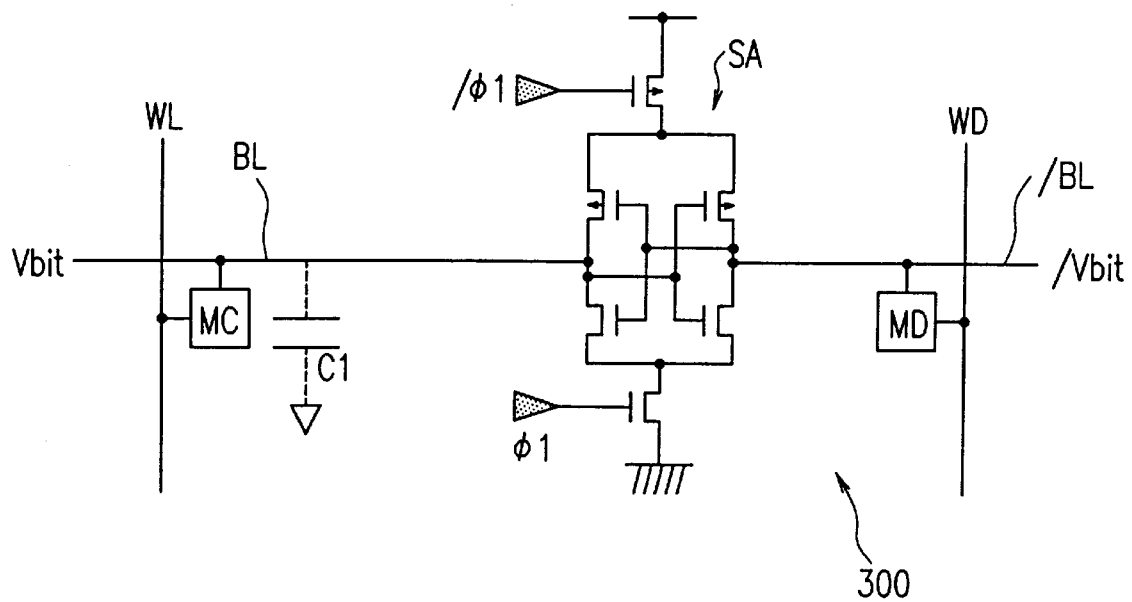
FIG. 5 is a circuit diagram showing a portion of a Dynamic Random-Access Memory (DRAM) 300 including the conventional open bit line system.
Figure 6:
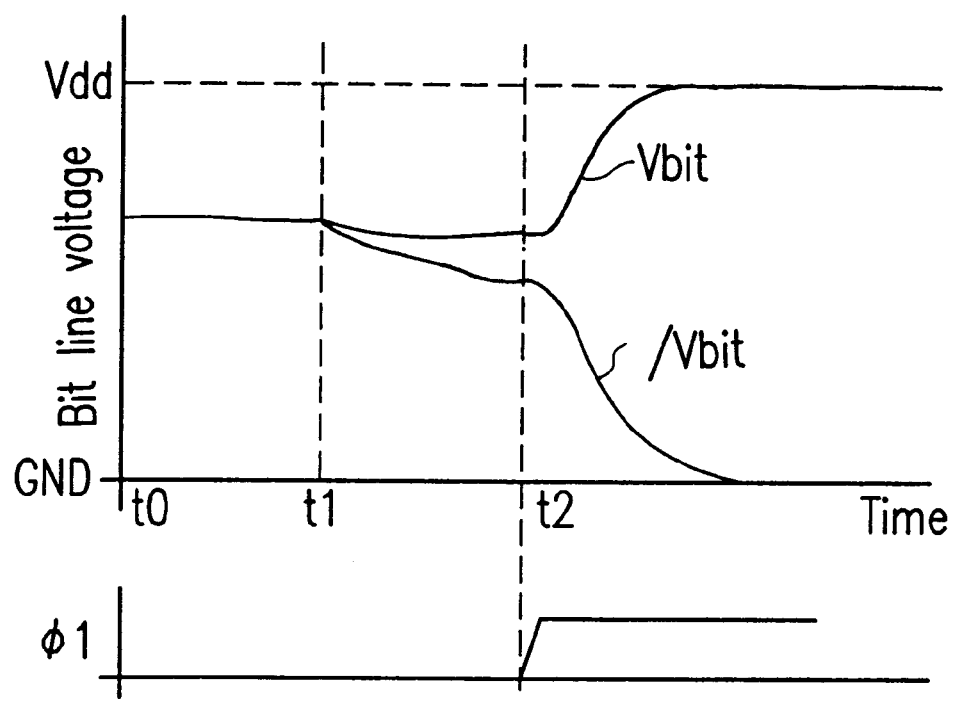
FIG. 6 shows an signal wave shape in an operation of reading cell data stored in the memory cell MC of the nonvolatile memory 300.
Figure 7:
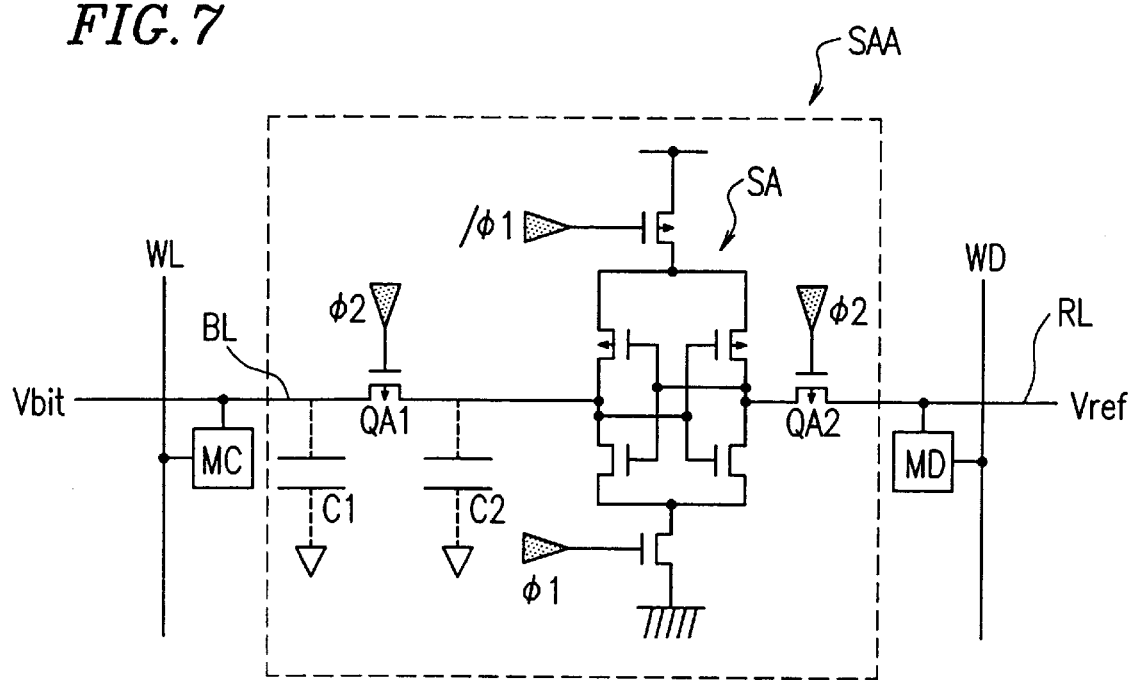
FIG. 7 is a circuit diagram showing a portion of another Dynamic Random-Access Memory (DRAM).
Figure 8:
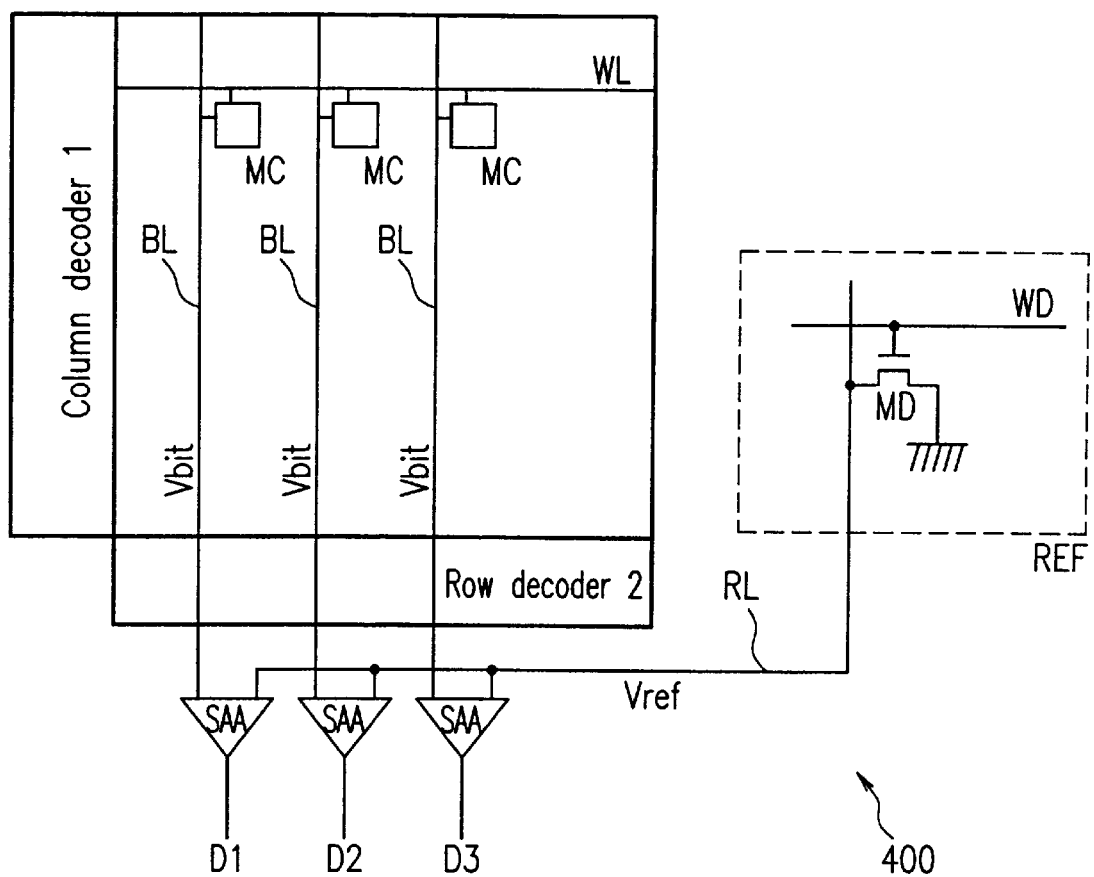
FIG. 8 shows a conventional nonvolatile memory 400.
Figure 9:
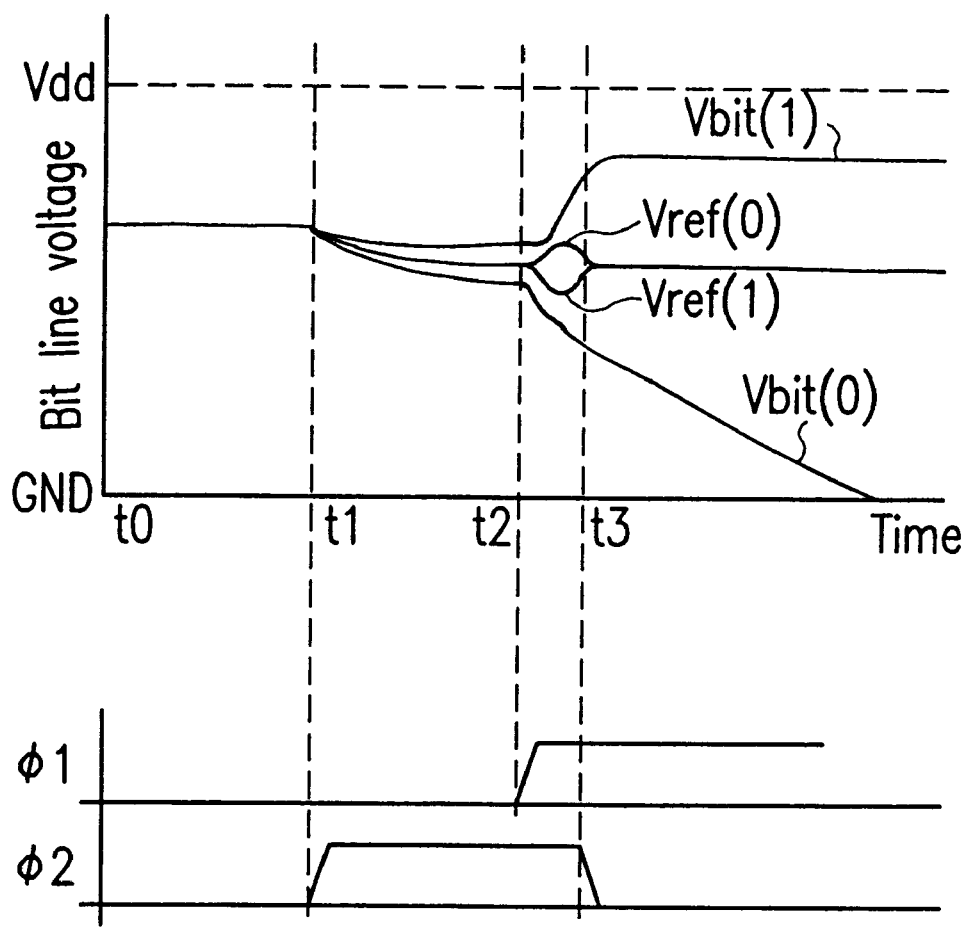
FIG. 9 shows a signal wave shape in an operation of reading cell data of the nonvolatile memory 400.

When the potential difference is sensed and latched, in the case where the memory cell MC is on, the potential Vbit of the bit line BL becomes the line Vbit (0) shown in FIG. 4, so that an output potential VD of the sense amplifier SA moves from Vdd to the line VD (0) shown in FIG. 4. Alternatively, when the potential difference is sensed and latched, in the case where the memory cell MC is off, the potential Vbit of the bit line BL becomes a line Vbit (1) shown in FIG. 4 so that an output potential VD of the sense amplifier SA moves to a line VD (1) shown in FIG. 4.

In Embodiment 2, one reference potential generation circuit REF is shared by a plurality of sense amplifiers as in Embodiment 1.

In Embodiment 2, since it is possible to decrease a load capacitance C2 connected to the output terminal of the sense amplifier SA as in Embodiment 1, the sense amplifier SA can operate at high speed. C1 represents a load capacitance of the bit line BL.

As described above in detail, according to a semiconductor memory of the present invention, while the surface area of the chip decreases, a high speed operation with the decreased consumption of electric power can be achieved.

Compared with the conventional semiconductor memory, in the semiconductor memory of the present invention, data can be extracted at high speed while the consumption of electric power is decreased.

Figure 10:
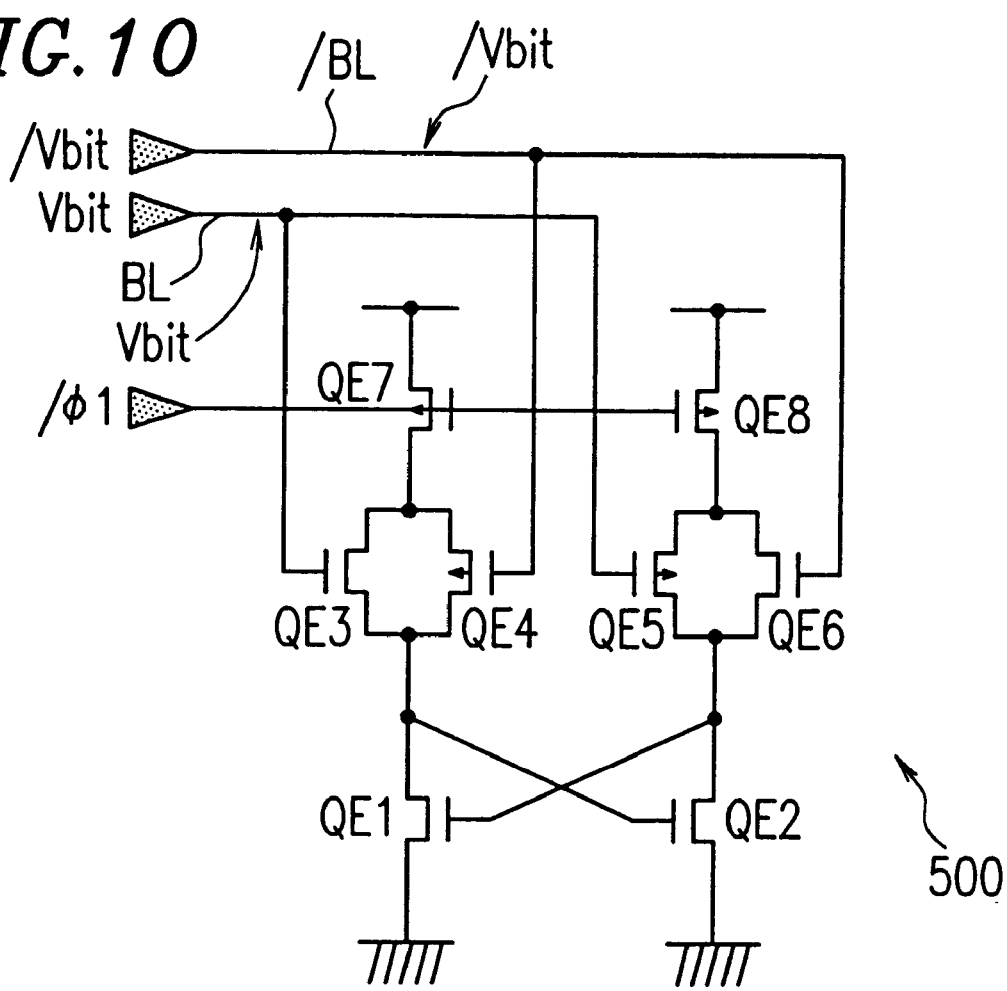
FIG. 10 is a circuit diagram of a sense amplifier 500 which is designed for decreasing the consumption of electric power.

For example, in the sense amplifier shown in FIG. 10, in order to restrict an increase in the consumption of electric power while the sense amplifier is activated, it is required to maintain the driving ability of the transistors QE3 to QE6 at a low level. When the driving ability of the transistors is reduced, the degree of the transition for the output potential of the sense amplifier is reduced. As a result, it becomes difficult to operate the memory at high speed. Therefore, it is impossible to extract data at high speed while the consumption of electric power is decreased.

On the other hand, in the semiconductor memory of the present invention, even when the driving ability of the load transistors is low, a power supply voltage is sufficiently provided to the sense amplifier so that the data can be extracted at high speed while the consumption of electric power is decreased.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:
1. A semiconductor memory comprising:
a sense amplifier for amplifying a potential difference between a potential of a first terminal and a potential of a second terminal;
a first load gate connected between the first terminal and a bit line; and
a second load gate connected between the second terminal and a reference line,
wherein:
a current flowing to the first load gate is controlled by a potential of the bit line;
and a current flowing to the second load gate is controlled by a potential of the reference line, wherein said reference line potential is independent of said bit line potential.

2. A semiconductor memory according to claim 1, comprising:
a first control gate connected to the first load gate; and
a second control gate connected to the second load gate,
wherein after an operation of the sense amplifier is completed:
the first control gate interrupts the current flowing to the first load gate; and
the second control gate interrupts the current flowing to the second load gate.

3. A semiconductor memory according to claim 1, wherein the sense amplifier is a latch-type sense amplifier.

4. A semiconductor memory according to claim 1, wherein the first and second load gates are MOS transistors.

5. A semiconductor memory according to claim 1, wherein the first and second control gates are MOS transistors.

6. A semiconductor memory according to claim 1, wherein:
a current output from the first load gate flows from the first load gate to the first terminal; and
a current output from the second load gate flows from the second load gate to the second terminal.

7. A semiconductor memory comprising:
a sense amplifier for amplifying a potential difference between a potential of a first terminal and a potential of a second terminal;
a first load gate connected between the first terminal and a bit line;
a second load gate connected between the second terminal and a reference line;
a first transfer gate connected between a reference potential point and the first load gate; and
a second transfer gate connected between the reference potential point and the second load gate,
wherein:
a current flowing to the first load gate is controlled by a potential of the bit line;
and a current flowing to the second load gate is controlled by a potential of the reference line, wherein said reference line potential is independent of said bit line potential.

* * * * *